United States Patent
Frutschy et al.

(10) Patent No.: US 6,786,739 B2
(45) Date of Patent: Sep. 7, 2004

(54) BRIDGE CLIP WITH REINFORCED STIFFENER

(75) Inventors: Kris Frutschy, Phoenix, AZ (US); Kevin George, Scottsdale, AZ (US); Kyle Kippes, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 59 days.

(21) Appl. No.: 10/262,407

(22) Filed: Sep. 30, 2002

(65) Prior Publication Data

US 2004/0063354 A1 Apr. 1, 2004

(51) Int. Cl.[7] ............................................... H01K 1/00
(52) U.S. Cl. .......................................................... 439/73
(58) Field of Search ................................... 439/73, 331

(56) References Cited

U.S. PATENT DOCUMENTS 6,442,026 B2 * 8/2002 Yamaoka ..................... 361/704
6,462,952 B1 * 10/2002 Ubukata et al. ............. 361/719

* cited by examiner

Primary Examiner—Neil Abrams
Assistant Examiner—Phuong Dinh
(74) Attorney, Agent, or Firm—Blakely, Sokoloff, Taylor & Zafman LLP

(57) ABSTRACT

An apparatus is described for a bridge clip used to hold an IC package to a process carrier in the semiconductor manufacturing processes. According to embodiments of the present invention, the bridge clip includes a bridge comprising a rectangular sheet having tabs at opposite ends the tabs having an irregular shape, a stiffener affixed to the bridge, the stiffener comprising a rectangular sheet sized to fit within the bent down tabs of the bridge and having a stiffening structure along a longitudinal axis of the stiffener, and a pressure plate coupled to the stiffener under the bridge and fitting within the tabs and long edges of the stiffener.

34 Claims, 9 Drawing Sheets

BRIDGE CLIP WITH REINFORCED STIFFENER

FIELD OF THE INVENTION

The various embodiments relate generally to the field of integrated circuit package manufacturing, and more particularly to a clip used to hold an IC package to a process carrier during manufacturing processes.

BACKGROUND

Manufacture of integrated circuit (IC) packages may involve, among other processes, the installation of an Integrated Heat Spreader (IHS) onto the IC package. During an IHS installation process, a heatspreader lid is adhered to a substrate while the package is mounted in a process carrier. The lid is affixed to the substrate using an epoxy adhesive and a layer of thermal grease is applied between the die and the lid. Thermal conductivity between the heatspreader lid and the die has been found to be dependent on the application force of the lid. A bridge clip is used to secure the package in the process carrier and apply force to the heatspreader lid during the application and cure stages of the lid. That is, once the heatspreader lid is in place, the bridge clip is fastened to the process carrier to hold the package in place in the process carrier and maintain an appropriate force on the heatspreader lid while the epoxy adhesive is being cured.

To ensure proper heat transfer from the substrate to the IHS, the force asserted by the bridge clip onto the IHS lid should be maintained within an appropriate range. Stiffness of the bridge clip is an important factor in any deviations in the resulting force from the bridge clip. However, excessive stiffness may result in a clip that degrades in performance after repeated insertion into the process carrier due to the clip being stressed when it is compressed to be latched to the process carrier.

Therefore, bridge clip designs address opposing goals. First, the bridge component links two latching points on the process carrier and applies a securing force on the center of the IHS lid. Therefore, the clip should have sufficient thickness and rigidity to allow it to maintain a steady force of 3–8 kg on the IC package. However, the clip should also be flexible enough to be easily and quickly manipulated by the handling equipment. Additionally, the clip should have sufficient spring characteristics to maintain its shape and dimensions through repeated manipulations by the handling equipment. These spring characteristics improve the clip's usable life span.

Previous bridge clip designs have focused on maintaining adequate stiffness to ensure that the proper amount of force is applied to the IHS lid. As a result, flexibility of the previous bridge clip designs is relatively low resulting in poor spring characteristics and a short usable life span. No previous bridge clip design has adequately addressed the contrary goals of maintaining adequate stiffness to ensure that the proper amount of force is applied to the IHS lid while remaining flexible enough to provide a long usable life span.

BRIEF DESCRIPTION OF THE DRAWINGS

Various embodiments, together with their advantages, may be best understood from the following detailed description taken in conjunction with the accompanying drawings that are used to illustrate these embodiments. In the drawings.

DETAILED DESCRIPTION

An apparatus is described for a bridge clip used to affix an Integrated Heat Spreader (IHS) lid to a substrate during the assembly process. According to embodiments of the present invention, the bridge clip consists of three mechanical components: a bridge; a stiffener; and a leaf spring. The bridge clip isolates the stiffener from the bridge thereby allowing selection of rigid materials for the stiffener and flexible materials for the bridge. According to another embodiment of the present invention, the stiffener can be formed into a structure to increase its rigidity without increasing its thickness.

A process carrier as may be utilized with various embodiments presented herein is essentially a metal plate with a number of evenly spaced cutouts of an appropriate size and shape to hold integrated circuit packages as they are transported through various manufacturing processes. A number of smaller cutouts are made in the carrier to provide a series of retention slots that will secure the ends of bridge clips to be mounted on the carrier. The bridge clip then secures the integrated circuit package to the process carrier. In some cases, additional devices are provided to further secure integrated circuit packages mounted on the process carrier. For example, the process carrier may have springs, clips, or latches to prevent the integrated circuit packages from shifting in the process carrier.

Figure 1:
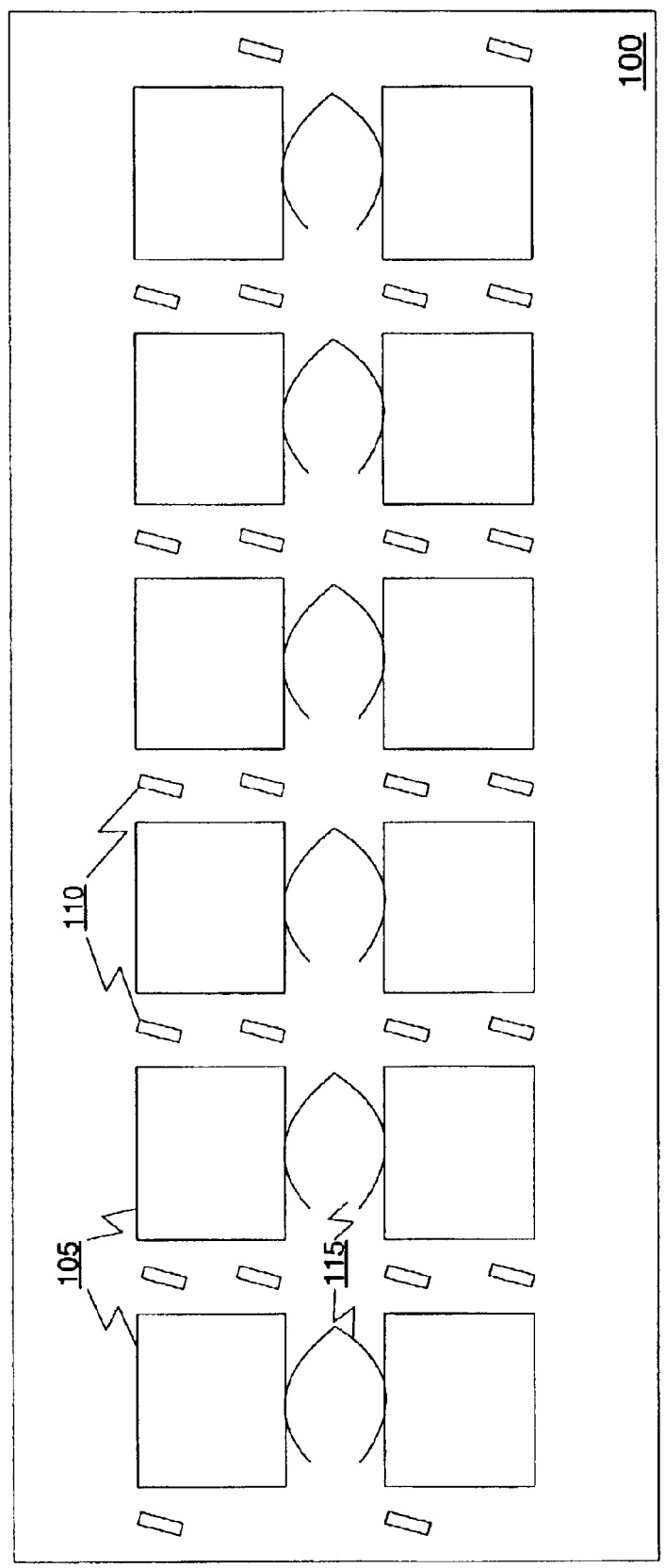
FIG. 1 is a top plan view of a process carrier with which various embodiments of the present invention may be utilized.

FIG. 1 is a top view of a process carrier with which various embodiments may be utilized. In this example, the process carrier 100 has several, e.g. twelve, integrated circuit (IC) package receptacles 105. Into each or some of these positions an IC package can be placed as will be described below with reference to FIGS. 2 and 3. The carrier 100 is then used to transport the packages through a manufacturing process such as an IHS installation process.

Near each IC receptacle 105 are a number of retention slots 110 into which the ends of the bridge clips are placed. One retention slot 110 is provided on either side of each IC receptacle 105, one for each end of the bridge clip. In the example of FIG. 1, the slots are evenly spaced between the IC receptacles to maximize the capacity of the process carrier. However, many other configurations are possible.

Figure 2:
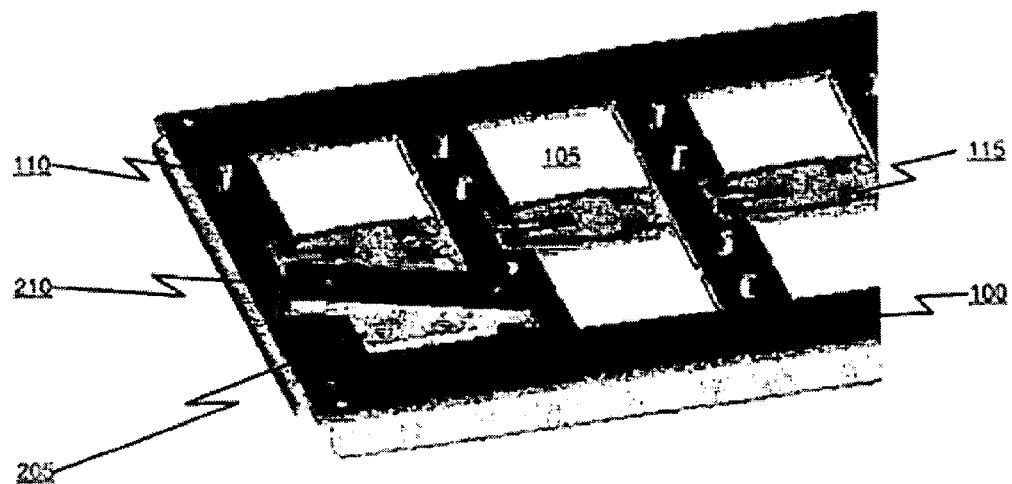
FIG. 2 is a perspective diagram illustrating a process carrier with an integrated circuit package and bridge clip mounted thereon according to one embodiment of the present invention.

Also, adjacent each IC receptacle 105, for example in the middle of the carrier 100, between the two illustrated parallel rows of IC receptacles are a series of side leaf springs 115. These springs 115, as can be seen in FIG. 2, press against packages mounted in the IC receptacles 105 to secure the packages in the receptacles 105 and prevent side-to-side movement of the packages.

Generally, the IC receptacles of the process carrier are constructed as a cutout of the appropriate size and shape to contain the ICs to be processed. Additionally, a tab or ledge can extend into the cutout portion around the edges of the cutout portion to retain the IC package in the carrier. Cutouts forming bridge clip retention slots are located along the sides of the receptacles. The spring tension of the leaf springs presses each package against an opposite ledge or wall of the respective IC receptacle.

Figure 1A:
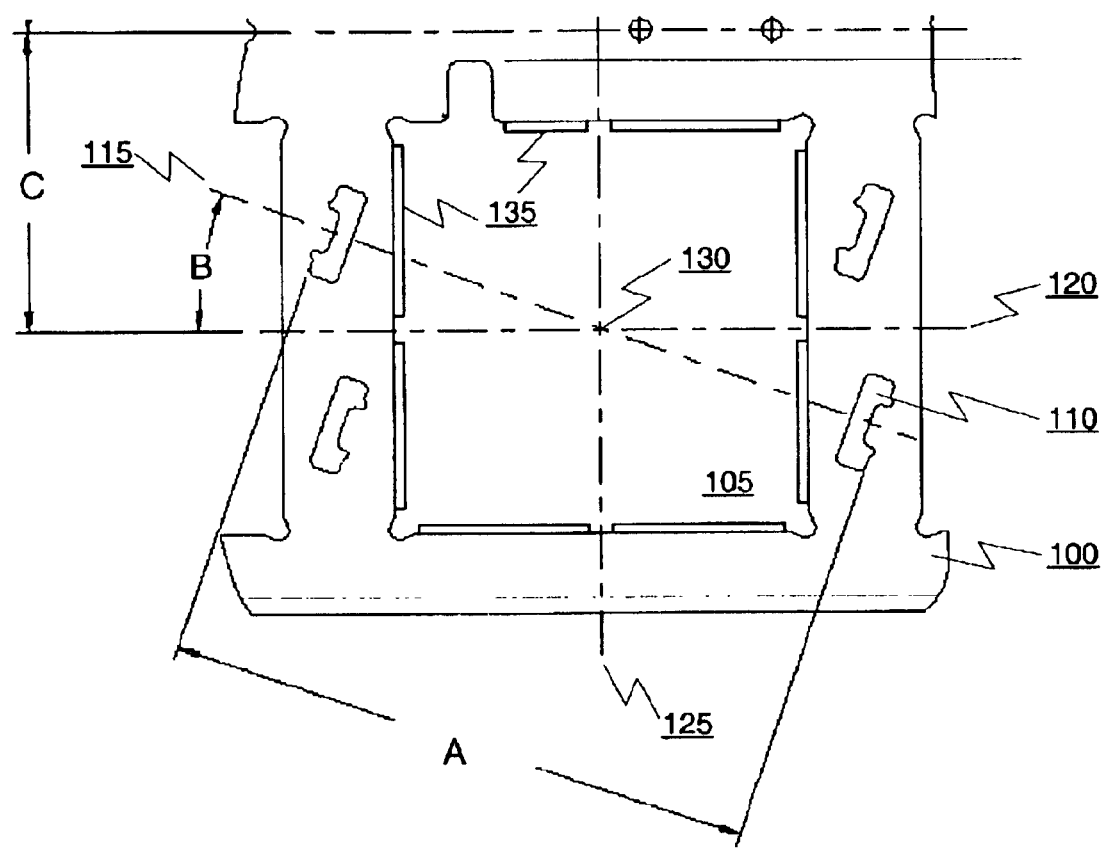
FIG. 1A is a top plan view of an IC receptacle of a process carrier with which various embodiments of the present invention may be utilized.

FIG. 1A is a top view of a portion of a process carrier including an IC receptacle. In this example, the retention slots 110 are formed as two U-shaped cutouts in the body of the process carrier 100 on opposite sides of the IC receptacle. However, other shapes are possible depending upon the configuration of the bridge clip. For example, the cutout may resemble a "T" shape if the ends of the bridge clip are shaped to correspond to such a cutout.

The ends of the bridge clip are each inserted into one of the retention slots 110 to hold an IC package in the IC receptacle 105. A line 115 represents the centerline of the bridge clip once it has been inserted into the retention slots 110. The centerline of the bridge clip 115 is angularly offset from a centerline 120 of the receptacle 105 to allow the receptacles to be more closely spaced on the process carrier 100. This angular offset is represented as B in FIG. 1A. However, the centerline of the bridge clip 115 passes over the centroid 130 of the IC receptacle 105 allowing the bridge clip to apply force through the center of the IC package.

Figure 3:
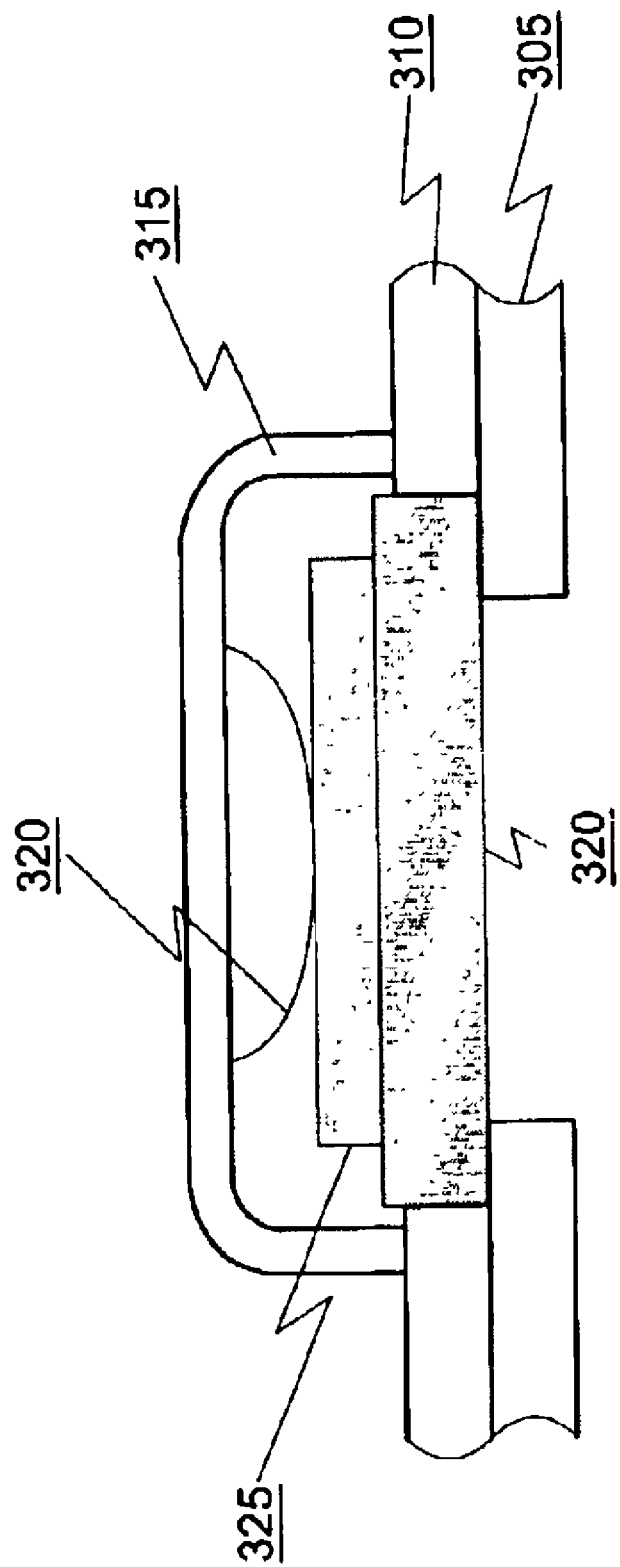
FIG. 3 is a side cross-sectional view of an IC receptacle of a process carrier with an integrated circuit package and bridge clip mounted thereon according to one embodiment.

Another detail of the process carrier 100 apparent in this example is the ledges 135 for holding the IC package. As can be seen in FIG. 3, the process carrier 100 is formed of two plates, 305, 310 that can be welded, riveted, bolted, or otherwise fixed together. The ledges 135 (shown in FIG. 1A) are formed by extensions of the lower plate extending into the cutout area of the receptacle 105 of the upper plate. The ledges 135 provide a surface upon which the IC package rests when placed into the receptacle 105.

Dimensions illustrated by references A, B, and C in FIG. 1A may vary widely depending upon the exact application of the process carrier. However, according to one example of a common process carrier, the distance between the outside edges of the retention slots 110 represented by reference A may be 69 mm. Also in the same process carrier, the distance between the centerline of the process carrier and the centerline of the receptacle, represented by reference C, may be 35 mm. Finally, the offset angle of the bridge clip, represented by reference B, may be 20 degrees.

FIG. 2 is a perspective diagram illustrating a process carrier with an integrated circuit package and bridge clip mounted thereon according to one embodiment. In this example, the process carrier 100 includes a number of IC receptacles 105, arranged in two parallel rows as described above, two retention slots 110 on either side of each receptacle, and side leaf springs 115 between the two rows of receptacles. An integrated circuit package 205 is shown mounted in one of the receptacles. Additionally, a bridge clip 210 is shown inserted into the appropriate retention slots on either side of the receptacle and extending across the top of the IC package to secure the IC package 205. The spring clip applies a spring tension downwards on the IC package against the process carrier.

The side leaf spring applies a lateral spring tension force against one side of the IC package, pressing the IC package against a side wall of the IC receptacle. As a result of these two spring retainers, the IC package is held securely in place. While the present drawings show leaf springs for both the horizontal and vertical forces, any other type of resilient or elastic structure can be used including coil springs and polymer gaskets. In FIG. 2, only one IC package and bridge clip is shown. Of course, in actual use, each IC receptacle 105 of the process carrier can be populated with an IC package 205 and bridge clip 210.

FIG. 3 is a side cross-sectional view of an IC receptacle of a process carrier with an integrated circuit package and bridge clip mounted thereon according to one embodiment. In this example, an IHS lid 325 is installed on the IC package 320. The IC package rests on a lower plate 305 of the process carrier and within the receptacle cutout of an upper plate 310 of the process carrier. A bridge clip 315 including a leaf spring 320 secures the IC package 320 in the process carrier and applies an appropriate downwards spring tension force to the IHS lid 325. The side leaf spring 115 is not visible in this view.

Figure 4:
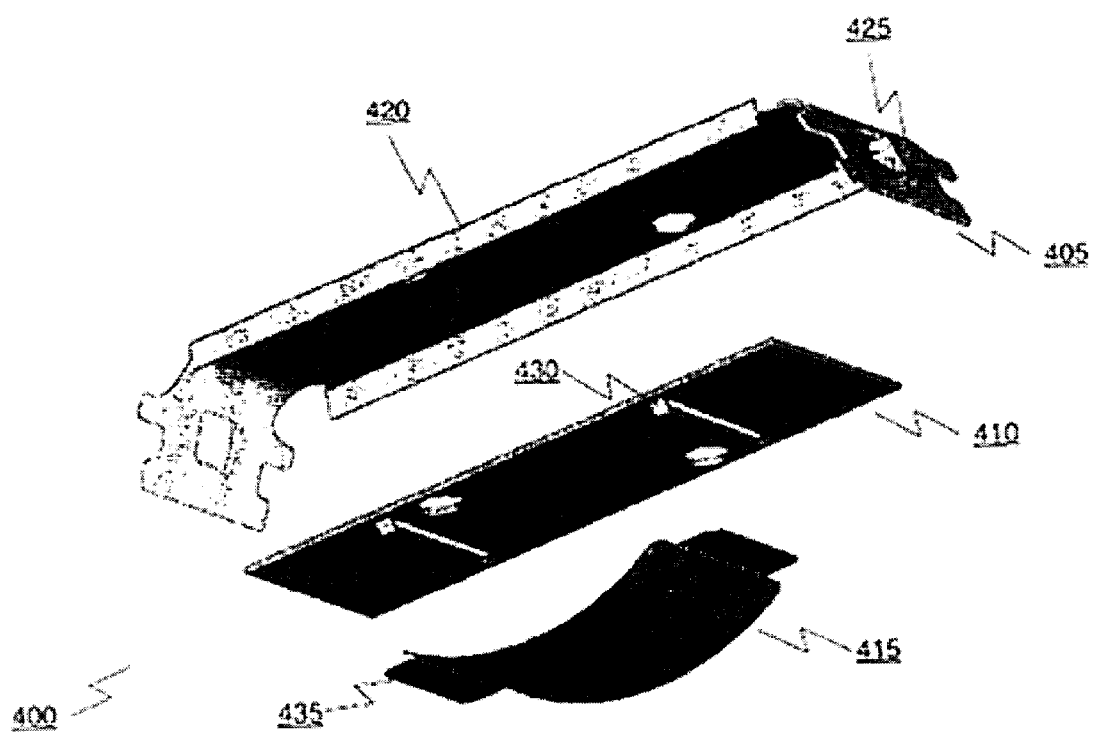
FIG. 4 is an exploded perspective view of a prior art process carrier bridge clip.

Referring to FIG. 4, a conventional bridge clip includes a bridge portion 405, a stiffener portion 410 and a pressure plate portion 415. The bridge portion is generally a rectangular metal plate with bent down tabs 425 at opposite ends. These bent down tabs may have cutouts of various shapes in various potions to allow the clip to mate with the corresponding retention slot in the process carrier. Additionally, the bridge portion will have some stiffening component, typically in the form of rolled down edges along the long side of the bridge. The stiffener portion is generally a flat, rectangular plate sized to fit under the bridge portion and within the bent down tabs and rolled down edges. The stiffener may have some means of retaining the pressure plate portion such as a pair of slots for retaining tabs 435 at the ends of a leaf spring 415. The pressure plate portion may be a leaf spring or other type of spring or tension device affixed to the stiffener, under the bridge portion. Each component of the bridge clip may be cut or formed into the required size and shape by stamping, lasering, Electrical Discharge Machining (EDM) the proper shape for the part from metal sheet stock or in other ways.

FIG. 4 is an exploded view of a prior art process carrier bridge clip. The bridge clip 400 consists of the three major components described above, the bridge 405, the stiffener 410, and the pressure plate 415. The bridge 405 has bent down tabs 425 extending from opposite ends that are inserted into the corresponding retention slots on a process carrier. The tabs 422 illustrated in this example are shaped to engage a retention slot with a "T" shape. These tabs 425 are designed to work with specialized handling equipment. They are flexible enough to be bent inward by the handling equipment when being inserted into the retention slots on the process carrier and have enough resiliency and spring force to properly engage the retention slots when released by the handling equipment. The edges 420 of the bridge 405 are rolled over to add rigidity. Therefore, the bridge not only functions to secure the bridge clip 400 to the process carrier but also contributes significantly to the overall stiffness of the assembled bridge clip 400.

The stiffener 410 is added to supplement the thickness and therefore stiffness of the bridge 405 when the bridge clip 400 is assembled. As shown, the stiffener 410 is a simple plate that fits the underside of the bridge 405 and adds to the assembled bridge clip 400 stiffness. The stiffener 410 may be mechanically fixed to the bridge 405 with spot welds or other means, such as rivets. The pressure plate, in this example a leaf spring 415, contacts the IHS lid and supplies an appropriate amount of force to the IHS lid when the bridge clip 400 is installed on a process carrier. Tabs 435 on the end of the leaf spring 415 are inserted into slots 430 in the stiffener to retain the leaf spring 415 in the bridge clip 400 when assembled.

A problem with this design, as described above, is that the same component, the bridge 405, used to latch the bridge clip 400 onto the process carrier is also a major contributor to the overall stiffness of the assembled bridge clip 400. Therefore, even though the bent over edges 420 of the bridge 405 and the stiffener 410 contribute to the overall stiffness of the assembled bridge clip 400, the material of the bridge component 405 must still be relatively thick to provide adequate stiffness. Since this material is relatively thick, the tabs 425 at the end of the bridge 405 are also relatively stiff. As a result, the tabs 425, as they are bent inward by the handling equipment, may not always have enough flexibility to spring back against the retention slot of the process carrier. Over repeated handling, these tabs will no longer be able to properly engage the retention slots of the process carrier and will limit the useful life of the entire bridge clip.

In one embodiment, the bridge clip of the present invention has a bridge portion, a stiffener portion, and a pressure plate portion. The bridge portion is notably thinner than in the prior art and lacks the stiffening structure of the rolled down edges. The stiffener is sized to fit within the bent down tabs of the bridge portion but may extend slightly beyond the long edges of the bridge. The stiffener portion is thicker than in previous bridge clip designs and contain some stiffening structure such as rolled down edges along the long sides, corrugations, or bars running in the longitudinal direction. The stiffener may have a means of retaining the pressure plate portion such as a pair of slots for retaining the ends of a leaf spring. The pressure plate portion may be a leaf spring or other type of spring affixed to the stiffener, under the bridge portion. Each component of the bridge clip may be cut or formed into the required size and shape by stamping, lasering, Electrical Discharge Machining (EDM) the proper shape for the part from metal sheet stock or in other ways.

Figure 5:
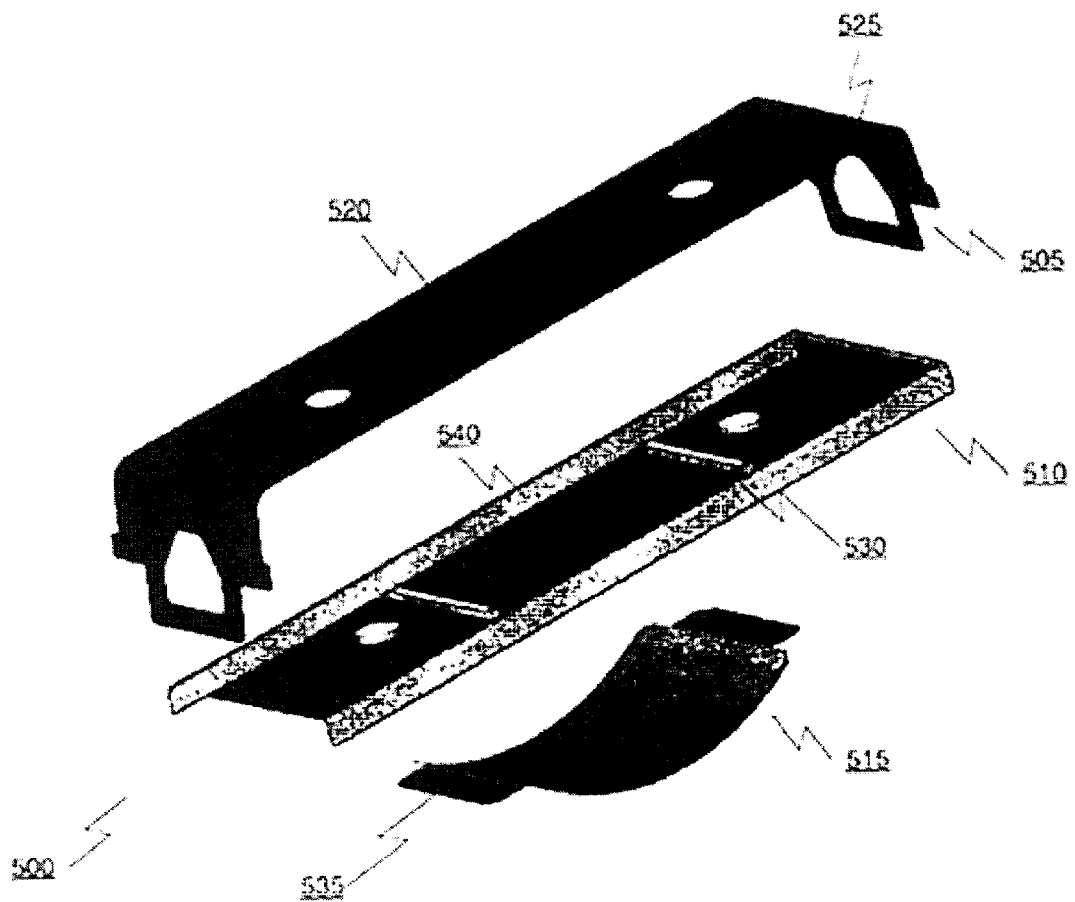
FIG. 5 is an exploded perspective view of a process carrier bridge clip according to one embodiment of the present invention.

FIG. 5 is an exploded view of a process carrier bridge clip according to one embodiment of the present invention. In this example, the bridge clip 500 has three major components: a bridge 505, a stiffener 510, and a pressure plate 515. The bridge 505, in the form of an elongated flat rectangular structure, has tabs 525 extending from each end. The tabs are adapted to be inserted into retention slots on a process carrier. The tabs 525 illustrated in this example are configured to engage a retention slot with a "U" shape. As mentioned above, these tabs may be of different configurations as required by the process carrier for which they may be used. For example, they may be configured to engage a "T" shaped retention slot on the process carrier. Each tab has a land 545 that rests on the top surface of the upper plate of the process carrier. The tabs in the present example are formed integrally with the flat rectangular surface of the bridge and are formed by bending an appropriately shaped single piece of metal. The tabs may alternatively be formed separately and attached to opposite ends of the flat portion.

Unlike the bridge clip illustrated in FIG. 4, the edges 520 of the bridge 505 are not rolled over. Due to this and other changes in the stiffener 510 described below, the bridge 505 functions mainly to secure the bridge clip 500 to the process carrier and does not contribute significantly to the overall stiffness of the bridge clip. Therefore, the bridge 505 may be thinner and more flexible than in previous designs.

The stiffener 510 is a second elongated rectangular flat surface that is added to supplement the thickness and therefore the stiffness of the bridge clip 500 when assembled. It has approximately the same dimensions as the bridge without the tabs, except that it is significantly thicker. The stiffener is most effective when it extends the entire length and width of the bridge, however, the relative dimensions of the stiffener and the bridge can be varied to meet particular design and material considerations. If the stiffener and the bridge are formed from substantially the same material, then the stiffener is of a thicker material and has added structures 540. The added structures 540 in the illustrated embodiment are formed of rolled-down edges along opposite long sides of the stiffener 510. Other structures may also or alternatively be used such as corrugations, ribbing, stringers, etc. depending on the materials used and the desired stiffness. The thicker material and rolled down edges contribute to greater stiffness, allowing the stiffener 510 to contribute more to the overall stiffness of the assembled bridge clip 500. The stiffener 510 can be mechanically fixed to the bridge 505 in any appropriate way including spot welds or rivets.

The pressure plate 515 contacts an IHS lid or other IC package surface and supplies an appropriate amount of force or pressure to the IHS lid when the bridge clip 500 is installed across the top of an IC package on a process carrier. In FIG. 5, the pressure plate 515 is in the form of a leaf spring. However, other structures that supply a relatively constant and predetermined resilient force may be used such as a helical spring, or elastomeric substance. The pressure plate is elongated as well and curved between the ends to create the spring tension. Integral tabs 535 are formed on each end of the leaf spring 515 and are specifically adapted to be inserted into corresponding slots 530 in the stiffener. The tabs retain the leaf spring 515 in the bridge clip 500 and also restrict the motion of the spring so that when the spring is pressed against an IC package lid by the bridge of the bridge clip, the spring will return a resilient force back toward the lid.

As shown, the leaf spring is about half as long as the stiffener, and narrow enough to fit between the rolled down edges of the stiffener. When the tabs are installed in the slots, the leaf spring is held in an arc. There is no special provision made for contacting the IHS lid. However, these details are not essential to the present embodiment of the invention. The leaf spring may be made in a variety of different shapes and configurations and additional surfaces or components can be provided to interact with the IHS lid. The leaf spring can be attached to the stiffener or the bridge and in a variety of different ways.

The embodiment of FIG. 5 allows the stiffener 510 to provide most of the stiffness of the assembled bridge clip 500 while the bridge 505 no longer contributes as much to this overall stiffness. Since the bridge 505 no longer contributes significantly to the overall stiffness of the assembled bridge clip 500, it may be of a thinner, more flexible material. The allows the bridge to be more elastic, more durable and easier to manipulate by the appropriate handling equipment.

Each component of the bridge clip may be cut or formed into the required size and shape by stamping, lasering, Electrical Discharge Machining (EDM) casting or molding the proper shape for the part from metal sheet stock or in other ways. The selection and shaping of the materials for the various parts of the bridge clip can be made with consideration of the desired forces, elasticity and spring constants for assembly and use. The components of the bridge clip can then be formed into the proper shape and fastened together by welding or by any other fastening process.

As can be seen in the figures, when the bridge clip is assembled, the stiffener is positioned between the bridge and the leaf spring. The leaf spring is designed to contact and interact with the IHS lid of the IC package and the bridge is designed to interact with the handler. The bridge and the leaf spring are both attached to the stiffener. The bridge can be attached e.g. with spot welds and the leaf spring can be attached e.g. using tabs. The stiffener, accordingly becomes a rigid structure that holds and defines the range of action of the flexible and, in this case, leaf spring structures that are attached to it. The stiffener allows for a greater amount of design latitude and a greater amount of flexibility in the bridge and the leaf spring than is possible in designs that use a more rigid bridge Further details of the assembled bridge clip and its individual components as well as exemplary materials for each will be described below with reference to FIGS. 6 through 8. In the following examples, specific dimensions and materials are discussed for illustrative purposes only. These dimensions have been selected for use with particular IC packages and process carriers. Other combinations of materials and sizes are clearly possible depending on the exact application.

Figure 6:
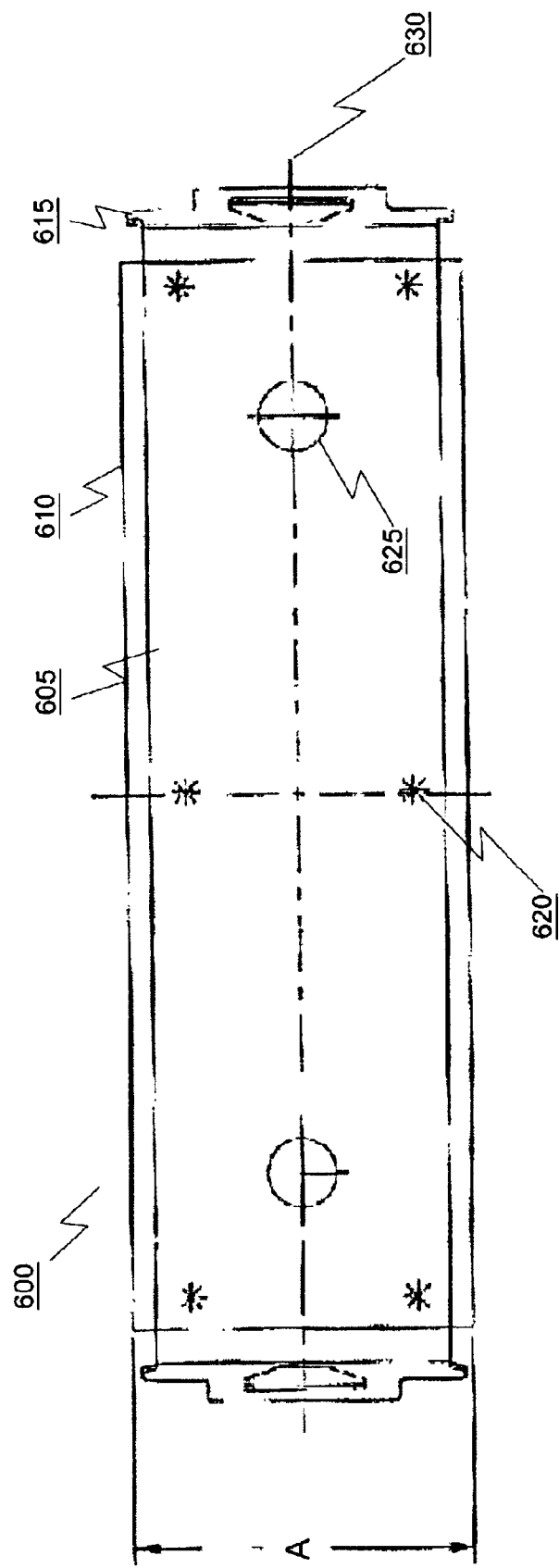
FIG. 6 is a top plan view of an assembled process carrier bridge clip according to one embodiment of the present invention.

FIG. 6 is a top plan view of an assembled process carrier bridge clip according to one embodiment. In this example, the bridge 605 and stiffener 610 portion of the bridge clip 600 may be seen. The tab 615 portions of the bridge 605 are also visible at either end of the bridge clip 600. Spot-weld locations 620 have been indicated on the four corners of the bridge and in the middle on each side of the bridge but are approximations. Other locations, number of welds or fastening methods may be utilized. Finally, two holes, through both the bridge 605 and stiffener 610 are shown. In this example, the holes are centered on the longitudinal centerline 630 of the bridge clip 600. However, other locations for the holes 625 may be used. The arrangement and location of the holes are for purposes of facilitating manipulation of the bridge clip 600 by handling equipment during the manufacturing process. Dimension A, representing the width of the assembled bridge clip 600, in one example may be 17 mm.

Figure 7:
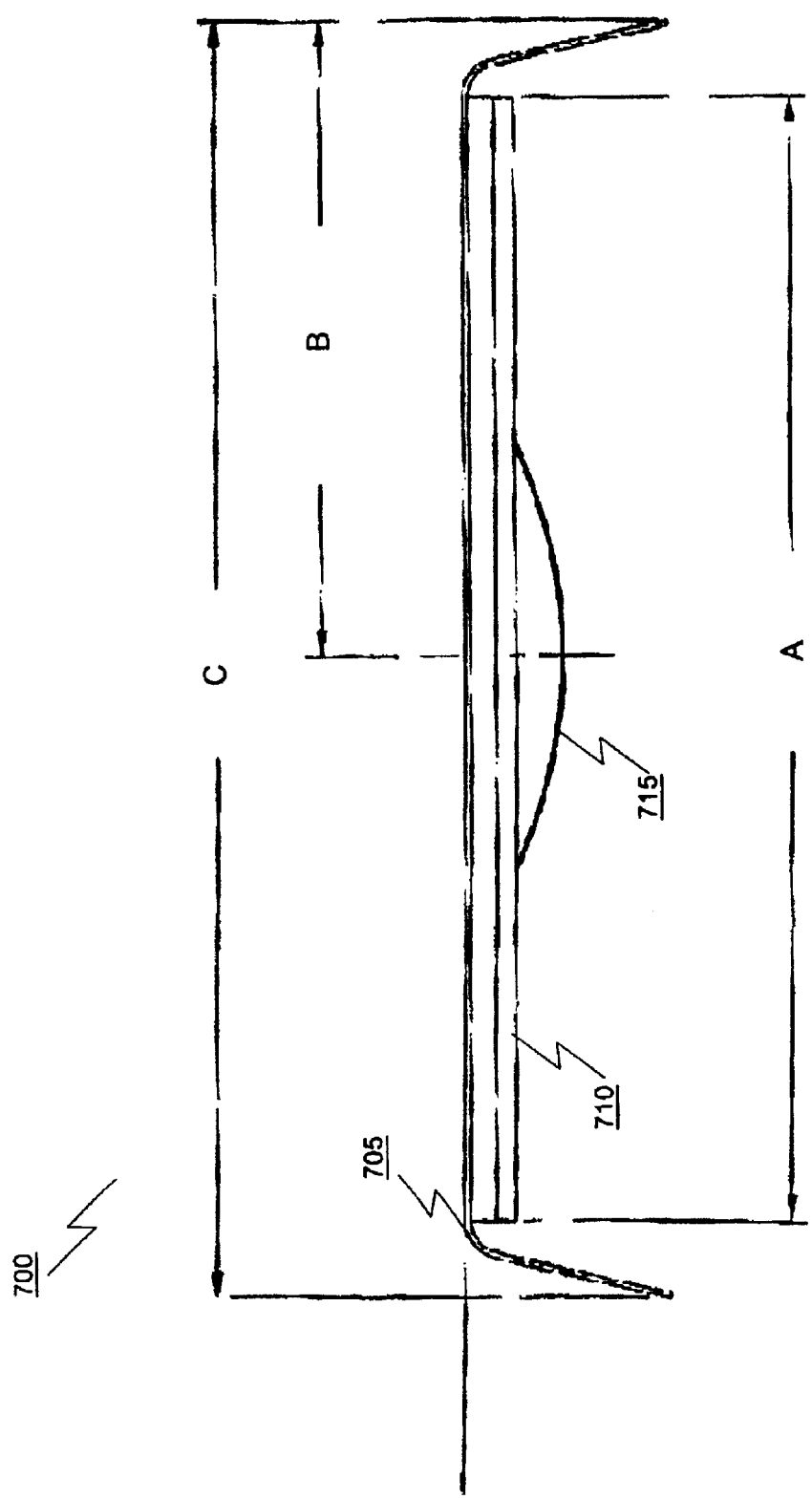
FIG. 7 is a side plan view of an assembled process carrier bridge clip according to one embodiment of the present invention.

FIG. 7 is a side plan view of an assembled process carrier bridge clip according to one embodiment. In this example, the bridge 705, stiffener 710, and leaf spring 715 portions of the bridge clip 700 may be seen. Dimension A, representing the length of the stiffener 710, in one example may be 53.6 mm. Dimension B, representing the length from the center of the assembled bridge clip to the end of the uncompressed bridge clip, in one example may be 30.5 mm. Finally, dimension C, representing the total length of the uncompressed assembled bridge clip 700, in one example may be 61 mm.

Figure 8:
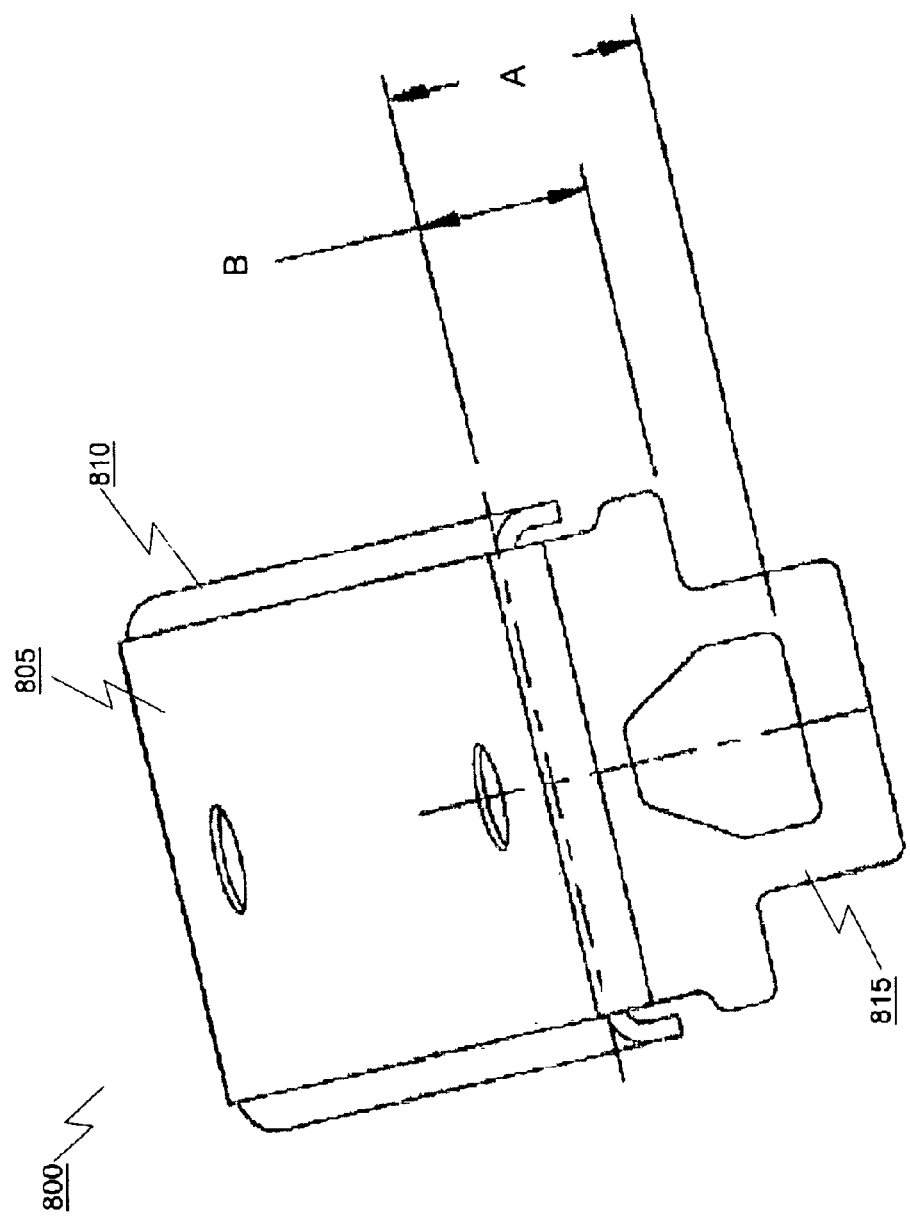
FIG. 8 is an perspective view of an end of an assembled process carrier bridge clip according to one embodiment.

FIG. 8 is perspective view of an end of an assembled process carrier bridge clip according to one embodiment. In this example, the bridge 805 and stiffener 810 portions of the bridge clip 800 may be seen. The tab 815 illustrated in this example is configured to engage a retention slot with a "U" shape. As mentioned above, the tab may be of a different configuration as required by the process carrier for which it may be used. For example, it may be configured to engage a "T" shaped retention slot on the process carrier. Dimension A, the distance in the tab from the flat portion of the bridge to the far base of a cutout in the tab, in one example, may be 7.9 mm. Dimension B, the length of the portion of the tab from the flat surface to the land that rests above the retention slot in the process carrier, in one example, may be 5.3 mm.

Materials used for the various portions of the bridge clip may vary. However, physical properties such as strength, hardness, resilience and flexibility should remain relatively consistent. Materials listed here are offered by way of example to illustrate those having physical properties believed to be suitable. Material for the bridge portion 805, in one example, may be Unified Numbering System (UNS) for metals and alloys S30100 or American Iron and Steel Institute (AISI) 301 stainless steel, full-hard per Aerospace Material Specification (AMS) #5519 0.25 mm thick and stress relieved at 300° C. for one hour. Material for the stiffener portion 810, in one example, may be 301 stainless steel, half-hard per AMS 5518 0.65 mm thick and stress relieved at 300° C. for one hour. Material for the leaf spring portion 815, in one example, may be 17–7 PH, condition C stainless steel per AMS 5529 0.125 mm thick heat treated to condition CH9000 per American Society for Metals (ASM) 5529.

In use, the assembled bridge clip will be stored on a tray or conveyor that will supply bridge clips to the appropriate handling equipment. This handling equipment, after placing an integrated circuit package into the process carrier and affixing a heat spreader, will pick up a bridge clip from the tray or conveyor. The handling equipment will contain a chuck of the appropriate size and shape to grab the bridge clip at opposite ends where the bent down tabs are located. The chuck will slightly compress the ends of the bridge clip bending the tabs inward. The handling equipment will then move the bridge clip to the process carrier, insert the clip into the carrier, and release the clip, allowing the bent down tabs to return to their uncompressed state and latch into the retention slots on the process carrier. The process carrier, once populated with integrated circuit packages and bridge clips, will be moved through an appropriate manufacturing process such as baking of the epoxy securing the IHS lid to the IC package.

After the manufacturing process has been completed, the chuck of the handling equipment will again compress the ends of the bridge clip so that it will disengage the retention slot of the process carrier. The clip will be removed from the process carrier and placed back on a tray or conveyor. The clip can then be inspected and/or reused.

In the description above, for purposes of explanation, numerous specific details are set forth in order to provide a thorough understanding of the present invention. It will be apparent, however, to one skilled in the art that the present invention may be practiced without some of these specific details. In other instances, well-known structures and devices are shown in diagram form.

While the present invention has been described in the context of a bridge clip for holding an IHS lid to an IC package, it can be applied to a wide variety of other types of processes and adapted for use in many different types of process carriers. For example, the apparatus described herein is useful in connection with many manufacturing processes that use an isolated unidirectional clamping force capable of withstanding high temperatures. The apparatus has been described in its most basic form but pieces, structures and components can be added to or deleted from any of the configurations and structures shown without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

What is claimed is:

1. A bridge clip, comprising:
   a bridge having an elongated surface with a tab at each and opposite ends for attaching to a process carrier,
   a stiffener adjacent to the bridge, the stiffener being substantially stiffer than the bridge to stiffen the bridge, wherein the stiffener is elongated and comprises rolled down edges along opposite, long sides of the stiffener; and
   a pressure plate adjacent to the stiffener between the tabs of the bridge to engage a surface of an integrated circuit package.

2. The bridge clip of claim 1, wherein the bridge tabs have an irregular shape to mate with retention slots on the process carrier.

3. The bridge clips of claim 1, wherein the bridge tabs are formed by a bend in the material of the bridge.

4. The bridge clip of claim 1, wherein the bridge is formed from single piece of stainless steel.

5. The bridge clip of claim 1, wherein the stiffener is fastened to the bridge by-using-one or more spot welds.

6. The bridge clip of claim 1, wherein the stiffener is formed from a single piece of stainless steel substantially thicker than the bridge.

7. The bridge clip of claim 1, wherein the pressure plate comprises a leaf spring.

8. The bridge clip of claim 7, wherein the pressure plate further comprises tabs at opposite ends of the leaf spring.

9. The bridge clip of claim 8, wherein the pressure plate tabs engage corresponding slots in the stiffener.

10. The bridge clip of claim 8, wherein the pressure plate is between the rolled down edges of the stiffener.

11. The bridge clip of claim 7, wherein the pressure plate tabs are formed by a bend in the material of the pressure plate.

12. The bridge clip of claim 7, wherein the pressure plate is formed from stainless steel having a thickness substantially thinner than the stiffener.

13. A bridge clip, comprising:
   means for engaging retention slots on a process carrier;
   means for stiffening the means for engaging, the means for stiffening being a discrete component separate from the means for engaging, wherein the means for stiffening comprises elongated rolled down edges; and
   means for providing a substantially constant pressure to an integrated circuit package retained in the process carrier.

14. The bridge clip of claim 13, wherein the means for engaging comprises tabs formed by bends at opposite ends of an elongated surface.

15. The bridge clip of claim 13 wherein the means for engaging further includes means for resiliently pressing the tabs in opposite directions with respect to each other.

16. The bridge clip of claim 13, wherein the means for engaging is formed from a single piece of stainless steel.

17. The bridge clip of claim 13, wherein the means for stiffening is rigidly attached to the means for engaging.

18. The bridge clip of claim 13, wherein the means for stiffening comprises means for increasing the rigidity of the bridge clip without reducing the flexibility of the means for engaging and the means for providing a pressure.

19. The bridge clip of claim 17, wherein the means for stiffening is formed of a single piece of stainless steel having a thickness greater than the means for engaging.

20. The bridge clip of claim 13, wherein the means for providing a pressure comprises means for applying a spring tension against the package with respect to the means for stiffening.

21. The bridge clip of claim 13, wherein the means for providing a pressure is rigidly attached to the means for stiffening.

22. The bridge clip of claim 13, wherein the means for engaging, the means for stiffening and the means for providing a pressure are each formed from different single piece of stainless steel each piece of stainless steel having a different thickness.

23. A method, comprising:
   attaching a process carrier using a bridge having an elongated surface with a tab at each and opposite ends;
   stiffening the bridge using a stiffener adjacent to the bridge, the stiffener being substantially stiffer than the bridge, wherein the stiffener is elongated and comprises rolled down edges along opposite, long sides of the stiffener; and
   engaging a surface of an a pressure plate adjacent to the stiffener between the tabs of the bridge to engage a surface of an integrated circuit package.

24. The method of claim 23, wherein the bridge tabs have an irregular shape to mate with retention slots on the process carrier.

25. The method of claim 23, wherein the bridge tabs are formed by a bend in the material of the bridge.

26. The method of claim 23, wherein the bridge is formed from single piece of stainless steel.

27. The method of claim 23, further comprises fastening the stiffener to the bridge using one or more spot welds.

28. The method of claim 23, wherein the stiffener is formed from a single piece of stainless steel substantially thicker than the bridge.

29. The method of claim 23, wherein the pressure plate comprises a leaf spring.

30. The method of claim 29, wherein the pressure plate further comprises tabs at opposite ends of the leaf spring.

31. The method of claim 30, further comprises engaging corresponding slots in the stiffener using the pressure plate tabs.

32. The method of claim 23, wherein the pressure plate is between the rolled down edges of the stiffener.

33. The method of claim 32, wherein the pressure plate tabs are formed by a bend in the material of the pressure plate.

34. The method of claim 23, wherein the pressure plate is formed from stainless steel having a thickness substantially thinner than the stiffener.

* * * * *

UNITED STATES PATENT AND TRADEMARK OFFICE
CERTIFICATE OF CORRECTION

PATENT NO. : 6,786,739 B2
DATED : September 7, 2004
INVENTOR(S) : Frutschy et al.

It is certified that error appears in the above-identified patent and that said Letters Patent is hereby corrected as shown below:

<u>Column 9,</u>
Line 30, delete "by-using-one" and insert -- by using one --.
Line 40, delete "8" and insert -- 1 --.

Signed and Sealed this

Thirty-first Day of May, 2005

JON W. DUDAS
*Director of the United States Patent and Trademark Office*